United States Patent [19]
Irregger et al.

[11] Patent Number: 5,963,889
[45] Date of Patent: Oct. 5, 1999

[54] PROCESS FOR THE COMPUTER-ASSISTED MEASUREMENT AND TESTING OF ELECTRIC CIRCUITS, ESPECIALLY ELECTRONIC MODULES, AND TESTING STATION FOR IMPLEMENTING THE PROCESS

[75] Inventors: Franz Irregger, Oberschlessheim; Horst Meissner, Fürstenfeldbruck; Harald Stephan, Unterschlessheim, all of Germany

[73] Assignee: Siemens Aktiengesellschaft, Munich, Germany

[21] Appl. No.: 08/952,890

[22] PCT Filed: May 23, 1996

[86] PCT No.: PCT/DE96/00906

§ 371 Date: Nov. 24, 1997

§ 102(e) Date: Nov. 24, 1997

[87] PCT Pub. No.: WO96/37839

PCT Pub. Date: Nov. 28, 1996

[30] Foreign Application Priority Data

May 23, 1995 [DE] Germany ............................ 195 18 928

[51] Int. Cl.[6] .......................... G06F 11/273; G01R 31/28
[52] U.S. Cl. ......................... 702/124; 702/118; 702/119; 371/22.1; 395/183.03

[58] Field of Search .................................... 702/124, 118, 702/119, 121, 122; 371/22.1; 395/183.03; 73/117.3

[56] References Cited

FOREIGN PATENT DOCUMENTS

WO 96/37839  11/1996  Germany.

OTHER PUBLICATIONS

"Providing Ada Based Test Program and Soft Panel Instrument Controls", by Dr. Jehuda Ziegler et al., ITT Avionics, NJ pp. 187–194.

*Primary Examiner*—John Barlow
*Assistant Examiner*—Hien Vo
*Attorney, Agent, or Firm*—Hill & Simpson

[57] ABSTRACT

A method for computer-aided measurement and testing of electrical circuits, and a test rig for carrying out such method, wherein the measurement and control tasks carried out by computer-aided measurement and test equipment during a test process, controlled by test software, for electrical circuits, are split into a data-relevant element, which contains test specification data and test instruction data, and a control-relevant test equipment driver section. The data-relevant element is formed in a text data field (TD) from which the control-relevant information can then be picked off. The invention can be used in all computer-controlled measurement and test rigs with measurement and control tasks as modular product-neutral test software.

4 Claims, 3 Drawing Sheets

PROCESS FOR THE COMPUTER-ASSISTED MEASUREMENT AND TESTING OF ELECTRIC CIRCUITS, ESPECIALLY ELECTRONIC MODULES, AND TESTING STATION FOR IMPLEMENTING THE PROCESS

BACKGROUND OF THE INVENTION

1. Field of the Invention

A method for computer-aided measurement and testing of electrical circuits using test software, and a test rig for carrying out such method, wherein the test software is split into a data-relevant element and a control-relevant element, the data-relevant element being formed in a text data field from which the control-relevant information can then be picked off.

2. Description of the Prior Art

Known computer-aided measurement and test procedures for electrical circuits, in particular for electrical assemblies, are carried out such that a dedicated software program must be written for each measurement and control task; such a software program contains both characteristic data, drivers and test routines, including evaluation requirements. The term test software in this case refers to that software which is required to control test equipment by means of computer-aided test rigs and for further processing of the measured data.

In most cases, programming is carried out on a product-oriented basis, that is to say the test program created can be used only for that particular unit. In addition, the structuring is directly dependent on the programmer. Only the originator can edit such programs. If the originator is no longer available, then the software must be recreated. Re-engineering is thus no longer possible. Consequently, known computer-controlled measurement and test procedures are also subject, in particular, to the following disadvantages: high production costs, very complex editing, no security of the know-how, and no program transparency.

The object of the present invention is to reduce the effort required for computer-aided measurement and test procedures for electrical circuits, in particular for electronic assemblies. Such object has particular relation to the production of software for carrying out measurement and control tasks using computer-aided measurement and test equipment.

SUMMARY OF THE INVENTION

This object is achieved in a method for computer-aided measurement and testing of electrical circuits using test software, and a test rig for carrying out the same, wherein the test software is split into a data-relevant element and a control-relevant element, the data-relevant element being formed in a text data field from which the control-relevant information can then be picked off. The splitting of the measurement and control tasks, into a data element and a test equipment driver element allows the effort for producing the software to be reduced by a factor of 3 to 10. By combining the data that are relevant to measurement tasks in a text data field, it is possible for anyone to carry out editing. This automatically results in a reengineering capability.

The test software can be designed to be product-independent. The output variables from the test specifications and the test instructions are kept transparent, that is to say these data are as legible as the basic document.

The text data field, which is located in the computer unit, expediently contains the test specification data, including stimuli and characteristic values, the test instruction data, including test step information and instructions, and a measurement data field accommodating test record data.

A test rig for carrying out the method according to the present invention is characterized by the use of a computer unit as a controller, a printer, a test equipment peripheral with the respectively required test equipment, for example a digital multimeter, and power supply units. Through the use of a test adapter for holding the electrical circuit, in particular the electronic assembly, in each case provided for testing it is possible for the power supply units to supply power to both the test adapter and the test equipment as there are connecting lines between the test equipment and the test adapter. The driver software is, in this case, used to control the test equipment available at the respective test rig. All the items of test equipment are connected to one another and to the computer via a standardized databus. The driver software is independent of the test rig used and is written only once for matching to the agreed text data field and contains the test routines required for the measurements.

Additional features and advantages of the present invention are described in, and will be apparent from, the detailed description of the preferred embodiments and from the drawings.

DETAILED DESCRIPTION OF THE PREFERRED EMBODIMENTS

Figure 1:
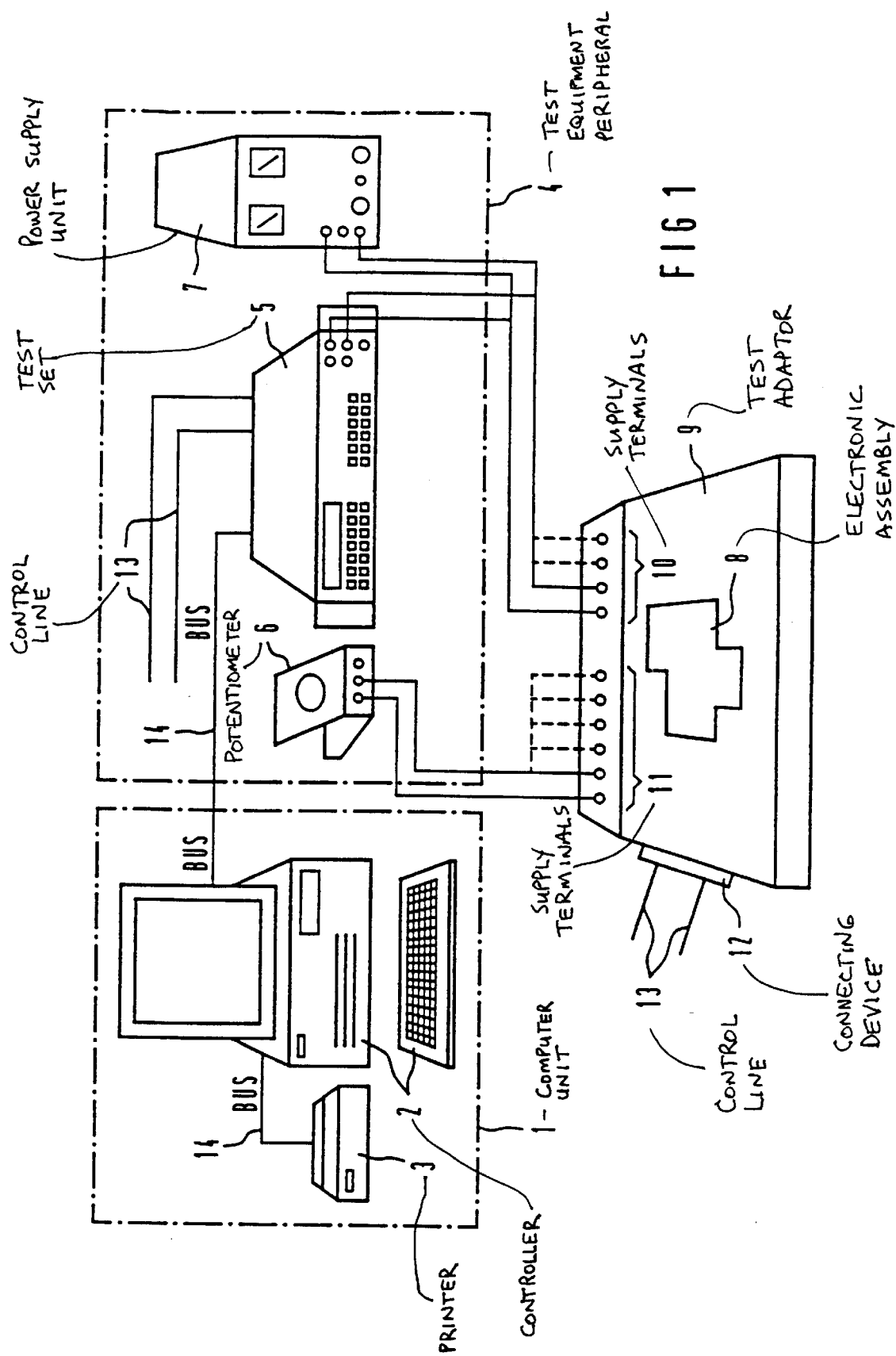
FIG. 1 is a schematic view of an embodiment of a test rig of the present invention.

The test rig illustrated in FIG. 1 contains a computer unit 1 having a controller 2, and a printer 3. Furthermore the test rig contains a test equipment peripheral 4 which, in the example in this case, is equipped with a digital multimeter as a single test set 5, with a potentiometer as an adjusting device 6, and with a power supply unit 7 for the power supply. The unit under test, in the example an electronic assembly 8, for power supply purposes, is inserted into a test adapter 9. Test adaptor 9 is provided with supply terminals 10 for the electrical power supply and supply terminals 11 for measurement and adjustment purposes and for the connection of the potentiometer 6 in the illustrated example. In addition, the test adapter 9 has a connecting device 12 for a control line 13 from the test set 5, in the example the digital multimeter. This test set 5 is connected to the computer unit 1 via a standardized databus 14.

Figure 2:
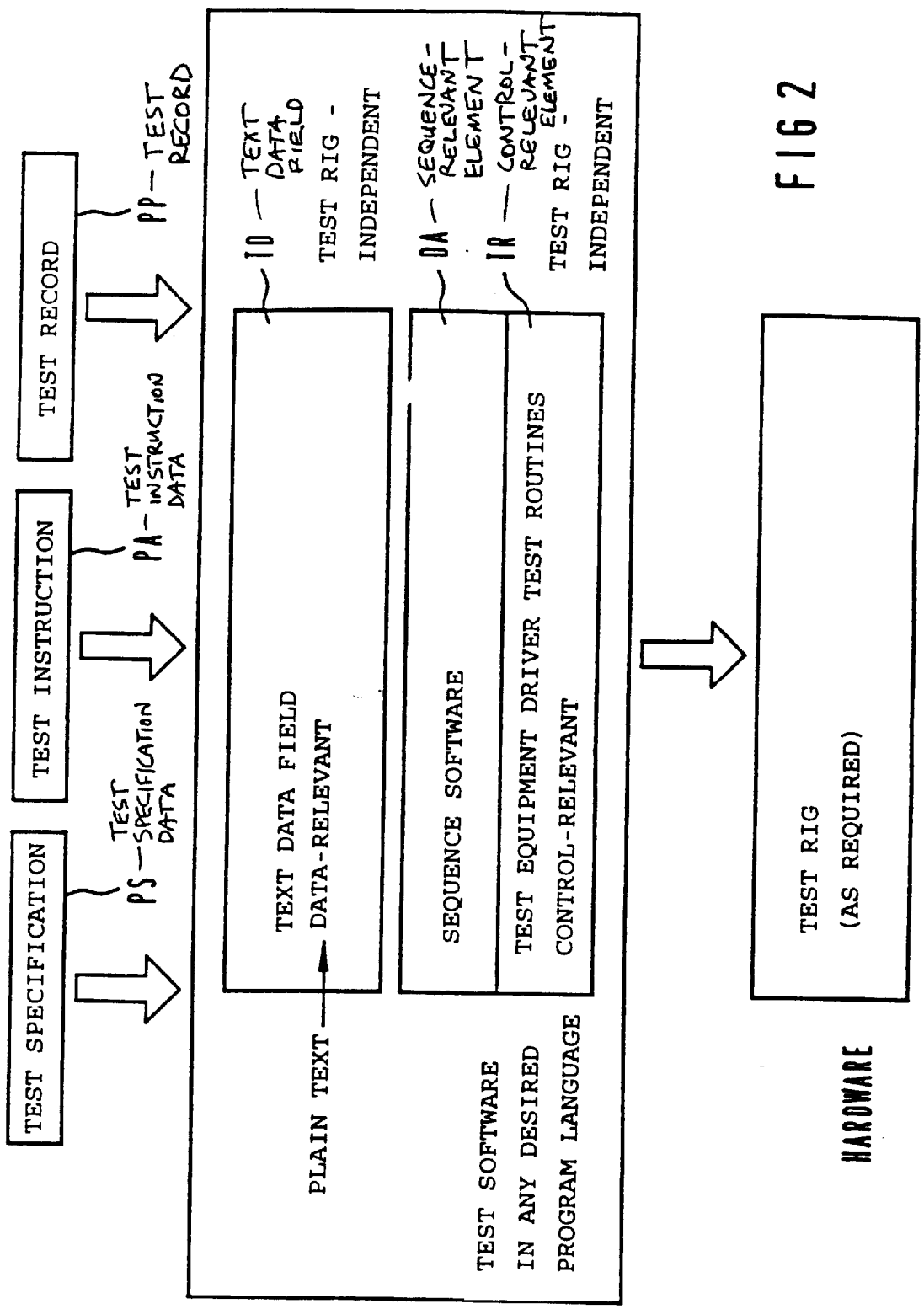
FIG. 2 is a block diagram schematic of an embodiment of the method of the present invention.

The basic structure illustrated in FIG. 2 for the method according to the present invention shows the splitting of the test software into a sequence-relevant element DA and a control-relevent element TR. The sequence-relevant element DA calls up the test specification data PS and the test instruction data PA in sequence from a text data field TD. The control-relevant element TR, containing the driver section which is independent of the respective electronic assemblies to be tested, is provided for the test equipment, as well as its test routines required for the measurements. The data-relevant element is formed in the text data field TD, from which the control-relevant information can be picked off by the test equipment drivers. Thus, the only remaining pure test software is the product-independent test equipment drivers and their test routines. The actual test sequence is provided from the sequence of the successive text steps in the text data field TD. The structure shows that the test software is designed to be product-independent. The output variables from the test specifications PS and from the test instructions PA are kept transparent. The driver software is used to control the test equipment available at the respective test rig and is independent of the test location used. It is written only once, for matching to the agreed text data field TD, and contains the test routines required for the measurements. The test software may be formulated in any desired programming language. At the end, the text data field TD contains a measurement data field for a test record PP.

Figure 3:
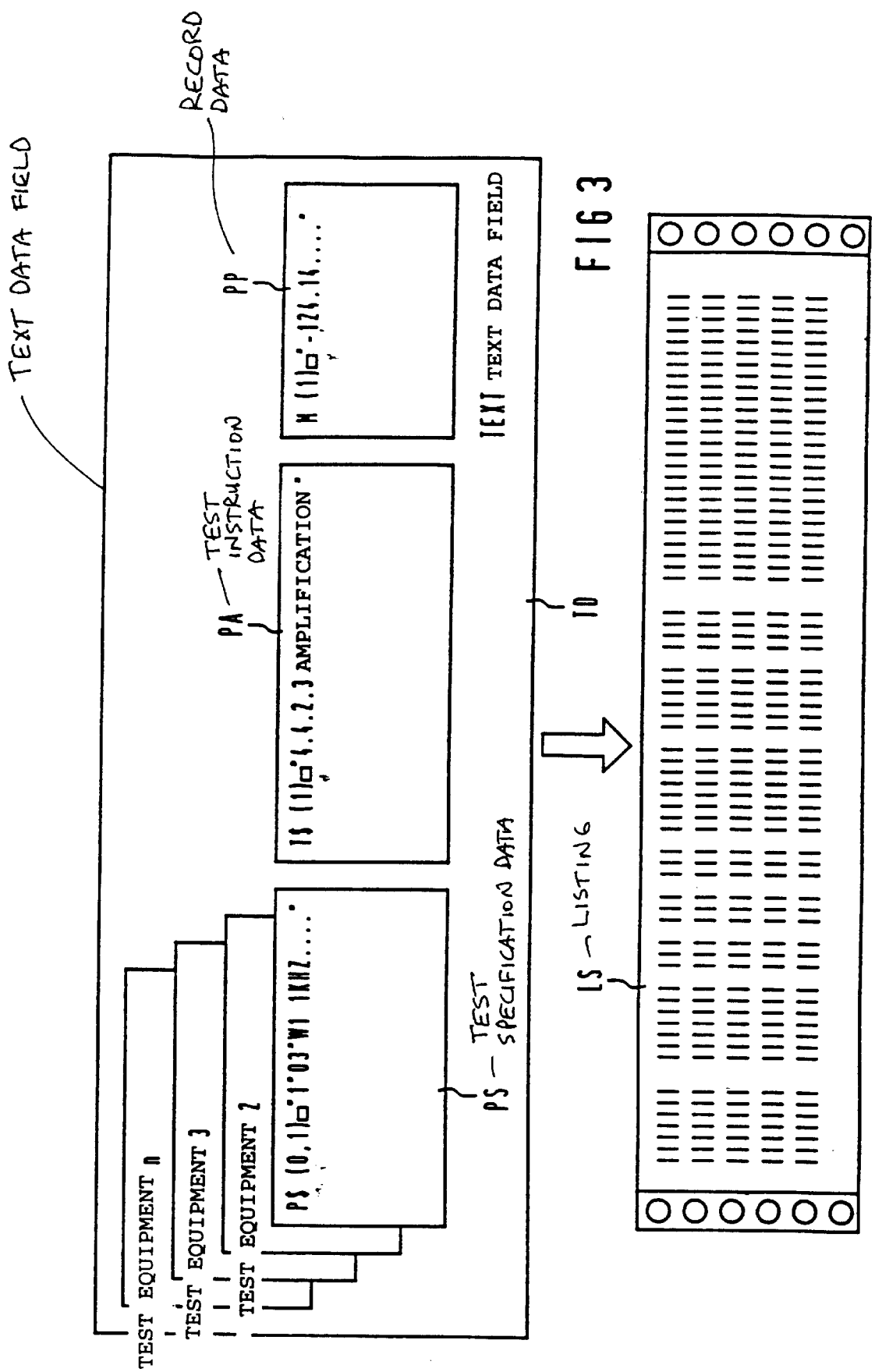
FIG. 3 is a diagrammatic representation of a text data field and, underneath it, a print-out of a listing of individual test steps for carrying out a test process according to a method of the present invention.

FIG. 3 shows an example of a text data field TD for a plurality of items of test equipment. The test specification data PS, with stimuli and characteristic values, are located on the left-hand side of the text data field TD. Test instruction data PA, including test step information and instructions, are arranged in the center of the text data field TD. A measurement data field, with record data PP, is located on the right-hand side. The test specification data PS on the left-hand side of the text data field TD shows the program sequence, or the test step sequence. TD, underneath the text data field TD illustrated in FIG. 3 is a listing LS of individual test steps in the text data field TD. This listing LS shows the transparent data field and can be printed out on the printer of the computer unit that is used.

The invention has the advantage in that the test data input is required only in plain text. This results in less stringent requirements for the qualification of the personnel, quick adaptation to changes, no dependency on know-how, and economic effectiveness even for quantities of less than 10. It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the hereinafter appended claims.

We claim:

1. A method for computer-aided measurement and testing of electrical circuits, the method comprising the steps of:

providing test software which defines measurement and control tasks during a test process, the test software to control test equipment which is available at a test rig and to further process measured data;

splitting the test software into a data-relevant element and a control-relevant element, the data-relevant element containing test specification data and test instruction data, the control-relevant element containing a driver section, which is independent of the electrical circuits to be tested, for the test equipment together with its test routines required for the processing of measured data;

designing the data-relevant element as a test data field from which unlimited control-relevant information can be picked off wherein the control-relevant element of the test software need be created only once so as to precisely match the test data field; and defining an actual test sequence with sequence software based on a sequence of successive test steps in the text data field.

2. The method as claimed in claim 1, further comprising the steps of:

locating the text data field in a computer unit;

providing test specification data in the text data field, the test specification data including stimuli and characteristics;

providing test instruction data in the text data field, the test instruction data including test step information and instructions; and providing a measurement data field in the text data field, the measurement data field maintaining test record data.

3. A test rig for carrying out the method as claimed in claim 1, comprising:

a computer unit serving as a controller;

a printer;

a test equipment peripheral having a plurality of required test equipment devices including a digital multimeter;

a test adaptor for holding an electrical circuit for testing;

connecting lines connected between the plurality of required test equipment devices and the test adaptor; and power supply units, the power supply units supplying power to both the test adaptor and the plurality of required test equipment devices.

4. The test rig as claimed in claim 3, further comprising:

a standardized data bus, the data bus connecting the plurality of test equipment devices to one another and to the computer unit.

\* \* \* \* \*